United States Patent

(12) United States Patent
Raynor (10) Patent No.: US 9,354,747 B2
(45) Date of Patent: May 31, 2016

(54) OPTICAL NAVIGATION DEVICE WITH A BACKLIGHT AND ASSOCIATED METHODS

(75) Inventor: Jeffrey M. Raynor, Edinburgh (GB)

(73) Assignee: STMICROELECTRONICS (RESEARCH & DEVELOPMENT) LIMITED, Marlow (GB)

(*) Notice: Subject to any disclaimer, the term of this patent is extended or adjusted under 35 U.S.C. 154(b) by 757 days.

(21) Appl. No.: 12/964,146

(22) Filed: Dec. 9, 2010

(65) Prior Publication Data

US 2011/0141487 A1 Jun. 16, 2011

(30) Foreign Application Priority Data

Dec. 10, 2009 (GB) .................................. 0921644.1

(51) Int. Cl.
*G06F 3/042* (2006.01)
*G01C 3/08* (2006.01)
*G06K 9/00* (2006.01)
(Continued)

(52) U.S. Cl.
CPC ...... *G06F 3/042* (2013.01); *G01C 3/08* (2013.01); *G06K 9/00* (2013.01); *H01L 27/14643* (2013.01); *H01L 27/323* (2013.01)

(58) Field of Classification Search
CPC ........ G01C 3/08; G01C 19/72; G01C 19/728; G01C 19/721; G06F 1/1626; G06F 1/1632; G06F 1/1673; G06F 3/0304; G06F 3/0426; G06F 3/0428; G06F 3/0416; G06F 3/042; G06F 3/043; G06K 7/10752; G06K 7/10742; G06K 7/10732; G06K 7/10851; G06K 9/2027; G02F 1/133602; G02F 2001/133612; G02F 2001/133613; H01L 31/0232

USPC ................... 345/76–204; 255/208.1; 315/151
See application file for complete search history.

(56) References Cited

U.S. PATENT DOCUMENTS

| 4,837,631 | A | * | 6/1989 | Hicks, Jr. | ................. | H04N 5/30 |
| | | | | | | 250/214 VT |
| 6,906,304 | B2 | * | 6/2005 | Knee et al. | ................. | 250/208.1 |
| 6,963,060 | B2 | * | 11/2005 | Knee | ................. | H01L 27/14643 |
| | | | | | | 250/208.1 |

(Continued)

FOREIGN PATENT DOCUMENTS

| JP | 2006018566 | 1/2006 | ............. G06F 3/042 |
| WO | 03/044956 | 5/2003 | ............. H03K 17/96 |

OTHER PUBLICATIONS

Han, "Low-cost multi-touch sensing through frustrated total internal reflection", Proceedings of the 18th Annual ACM Symposium, Oct. 2005, pp. 115-118.

*Primary Examiner* — Kent Chang
*Assistant Examiner* — Herbert L Hagemeier
(74) *Attorney, Agent, or Firm* — Allen, Dyer, Doppelt, Milbrath & Gilchrist, P.A. Attorneys at Law (57) ABSTRACT

An optical navigation device includes a navigation radiation source capable of producing a beam of radiation, and an optical element. The optical navigation device is for identifying movement of an object to thereby enable a control action to be carried out. A sensor is for receiving an image based upon reflected radiation from the navigation radiation source, and at least one illumination radiation source is for illuminating the optical navigation device. The device is operable, in recurrent cycles of at least reset, expose, and readout phases, to activate the at least one illumination radiation source during the reset phase. The reset phase may have the longest duration of the phases.

48 Claims, 4 Drawing Sheets

(51) Int. Cl.
*H01L 27/146* (2006.01)
*H01L 27/32* (2006.01)

(56) References Cited

U.S. PATENT DOCUMENTS

| | | | |
|---|---|---|---|
| 7,486,386 B1* | 2/2009 | Holcombe | G01C 3/08 |
| | | | 356/4.01 |
| 7,488,926 B2* | 2/2009 | Knee et al. | 250/208.1 |
| 7,502,061 B2* | 3/2009 | Raynor | 348/308 |
| 7,557,338 B2* | 7/2009 | Gruhlke et al. | 250/221 |
| 7,924,272 B2* | 4/2011 | Boer et al. | 345/175 |
| 8,131,025 B2* | 3/2012 | Iseri et al. | 382/124 |
| 2002/0024605 A1* | 2/2002 | Merrill et al. | 348/296 |
| 2004/0252867 A1* | 12/2004 | Lan | G06K 9/0004 |
| | | | 382/124 |
| 2005/0104983 A1* | 5/2005 | Raynor | 348/294 |
| 2005/0281475 A1 | 12/2005 | Wilson | 382/254 |
| 2006/0103637 A1 | 5/2006 | Yamaguchi et al. | 345/175 |
| 2007/0164999 A1* | 7/2007 | Gruhlke | 345/166 |
| 2008/0211787 A1 | 9/2008 | Nakao et al. | 345/175 |
| 2008/0252618 A1* | 10/2008 | Chung et al. | 345/175 |
| 2009/0027358 A1* | 1/2009 | hosono | 345/175 |
| 2009/0161051 A1* | 6/2009 | Fukunaga et al. | 349/115 |
| 2009/0213093 A1 | 8/2009 | Bridger | 345/175 |
| 2009/0213095 A1 | 8/2009 | Harada et al. | 345/175 |
| 2009/0289920 A1 | 11/2009 | Chiang et al. | 345/175 |
| 2010/0007632 A1* | 1/2010 | Yamazaki | 345/175 |
| 2010/0302160 A1 | 12/2010 | Reigneau | 345/166 |

* cited by examiner

OPTICAL NAVIGATION DEVICE WITH A BACKLIGHT AND ASSOCIATED METHODS

FIELD OF THE INVENTION

The present invention relates to optical navigation devices, and, particularly, but not exclusively, to miniature devices for use in a variety of different applications.

BACKGROUND OF THE INVENTION

Current mobile or computer devices use a variety of different navigation mechanisms. Some of these present a mousing surface for direct manipulation by a finger (or other part of the body), and work by producing images of the finger as it moves on the mousing surface, translating this finger movement to movement of a cursor (for example) on a screen. In this respect a navigation device of this type works in a similar fashion to an optical mouse, and is referred to as an optical navigation device.

It is often desirable to have an optical navigation device backlit. However, this can lead to performance degradation should the backlight remain on constantly. This means that the backlight illuminates the mousing surface and degrades the contrast of a fingerprint, thereby reducing the signal-noise ratio of the acquired image.

SUMMARY OF THE INVENTION

It is an object to address the above drawbacks. In a first aspect, there is provided an optical navigation device comprising a navigation radiation source capable of producing a beam of radiation, and an optical element for identifying movement of an object to thereby enable a control action to be carried out. The optical navigation device also includes a sensor for receiving an image based upon reflected radiation from the navigation radiation source, and at least one illumination radiation source for illuminating the optical navigation device. The device is operable in recurrent cycles of at least reset, expose and readout phases and to activate the at least one illumination radiation source only during the reset phase, the reset phase having the longest duration of the phases.

The device preferably also operates in a calibration phase. The device may operate in cycles of the reset, calibration, expose and readout phases, the reset phase being operable to reset the sensor to a predetermined level, the calibration phase being operable to determine the appropriate sensor output level in the absence of light, the expose phase for obtaining the image and the readout phase for outputting the image.

The reset phase may have a duration comprising 50% or more of the total duration of each cycle of phases. The device may be operable to switch off the illumination radiation source shortly before the end of the reset period. The device may be operable not to activate the illumination radiation source during cycles in which the sensor receives images indicative of movement of the object and/or images with detectable features.

The device may be operable such that the duration that the illumination radiation source is activated during each reset cycle is variable so as to control illumination intensity. Preferably, the device is further operable such that the duration that the illumination radiation source is activated does not alter the duration of the reset phase.

The device may be operable such that the illumination radiation source is controllable by the navigation device and/or a host device in which the navigation device is comprised.

The illumination radiation source may be activated dependent upon a status of the navigation device and/or the host device.

In addition, the device may be operable such that the duration of each of the cycles of phases may be variable, such that the device may operate in a number of modes. The device may comprise a plurality of illumination radiation sources.

Each one of the plurality of illumination radiation sources may be arranged to illuminate different portions of the navigation device. The plurality of illumination radiation sources may output visible light, each with a different colour. In a main embodiment, there may be three such illumination radiation sources, each outputting an additive primary colour.

The device may be operable to turn one of the plurality of illumination radiation sources on at one time. The device may be further operable to allow two or more of the plurality of illumination radiation sources to be turned on during a single reset period, such that the ratio of durations that each illumination radiation source is turned on determines the perceived illumination colour. The ratio may be controllable by the navigation device and/or a host device in which the navigation device is comprised. The ratio may be dependent upon a status of the navigation device and/or the host device. The device may be operable to set the ratio proportionally, with a further parameter to set illumination intensity.

The device may be operable such that each one of the illumination radiation sources is able to be turned on for substantially the full reset phase duration. Alternatively, the device may be operable such that each one of the illumination radiation sources is able to be turned on for only a proportion of the reset phase duration, the proportion being substantially the reciprocal of the number of illumination radiation sources.

The optical element may be formed from a single piece construction and may include at least one frustrated total internal reflection (F-TIR) surface capable of causing frustrated total internal reflection of the beam of radiation when the object contacts the first surface to thereby generate the image which is capable of being translated into the control action. The optical element may comprise at least one further surface for directing radiation from the radiation source to at least one F-TIR surface. The optical element may comprise at least one additional surface for directing radiation from the F-TIR surface to the sensor.

BRIEF DESCRIPTION OF THE DRAWINGS

Embodiments of the invention will now be described, by way of example only, by reference to the accompanying drawings, in which.

DETAILED DESCRIPTION OF THE PREFERRED EMBODIMENTS

The present invention relates to an optical navigation device module for use in a device. The device may be of any appropriate type and may include mobile phones, PDAs, Laptop computers, TV remotes, games controls and other such devices herein referred to as a computer application.

Figure 1:
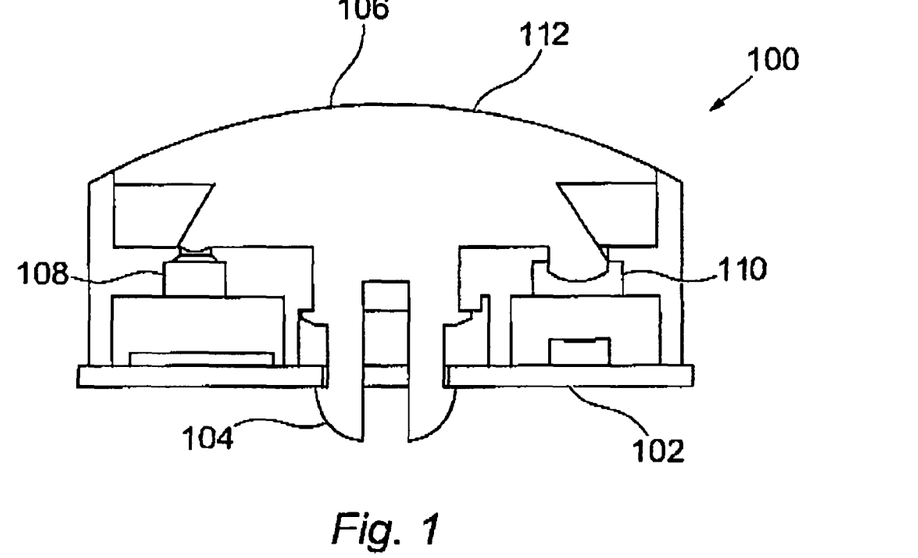
FIG. 1 is a cross-sectional diagram of an optical navigation device, suitable for application of the present invention, given by way of example.
Figure 2:
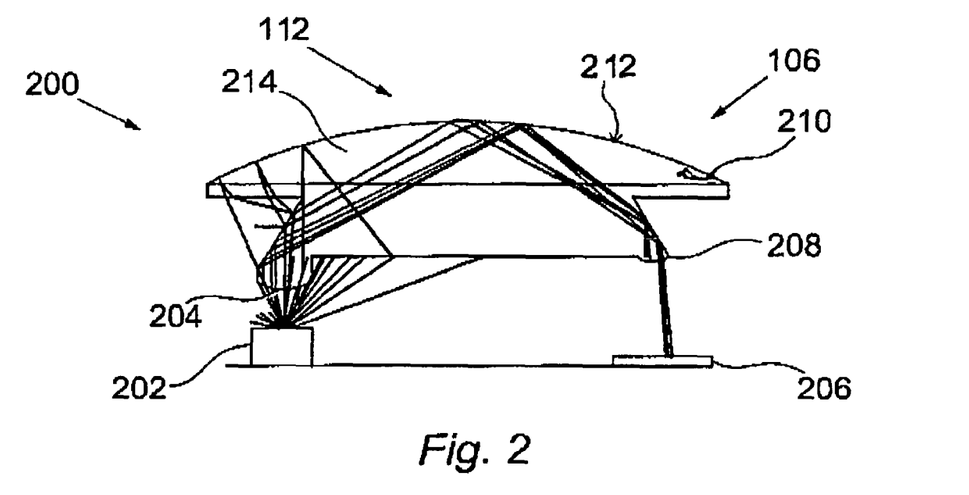
FIG. 2 is an optical diagram of the FIG. 1 device, given by way of example.

FIGS. 1 and 2 show a particular type of optical navigation device module suitable for the application of the present invention. This optical navigation device module is described in detail in co-pending application number GB0908899.8. It should be noted that this optical navigation device is described by way of example only, and any suitable optical navigation device using reflection off a mousing surface can be used.

The optical navigation device module 100 includes a base plate 102, an optical element 106 which incorporates a clip 104 (the optical element will be described in greater detail below), an illumination source 108, such as an LED, and a sensor 110. The overall construction of the optical navigation device module 100 is of a low profile construction making it suitable for mobile devices. The actual size of the overall package containing the optical navigation device sits under a cap of about 7 mm in diameter and the module itself has a maximum dimension of about 5.8 mm.

The optical element 106 may be molded from a single piece of plastic and provides a so called mousing surface 112. An example of the type of plastic material is a monolithic optical block made of a plastics material such as poly (methyl methacrylate) also known as PMMA, although it will be appreciated other materials (such as Polycarbonate, Cycicyclophane copolymer) may alternatively be used.

As can be seen in FIG. 2, this particular type of optical navigation device uses the optical layout for a frustrated total internal reflection (F-TIR) device 200, although direct imaging systems and other systems are equally applicable to be used in place of the F-TIR device 200.

The F-TIR device 200 includes an LED 202 which emits a source of radiation directed by optical element 204 to the internal surface 210 of the mousing surface 112. A further optical element 208 then directs any reflected radiation from surface 210 on to sensor 206.

The LED 202 may be of any appropriate type and may be mounted on a substrate. In a particular example the LED emits in the near infrared range for example between about 700 to 900 nm.

The optical element 204 directs the LED illumination into the monolithic optical block which forms the optical element 106. The optical element 204 may be in any appropriate to form, for example, a single convex surface, a series of lenslets configured as a "fly eye" structure, or any other suitable structure capable of providing near collimated illumination at the internal surface 210. The optical element 204 may be capable of being tilted in order to control the illumination pattern and direction of the beam at the mousing surface.

The mousing surface 112 includes an internal surface 210 and an external surface 212. At the mousing surface, any object with a refractive index which is placed in contact with the external surface 212 may frustrate the total internal reflection of the beams 214 at the internal surface 210. A suitable object may include a finger, pointer, hand or other object or feature. A so-called frustrated reflection will thus be generated and the resulting pattern is focused by optical element 208 onto the sensor 206.

The internal surface 210 is relatively smooth when compared to the features which give rise to the F-TIR. Illumination reflected from the internal surface 210 when there is no object close to the mousing surface is virtually 100% reflected. However, when the reflection is frustrated, about 10% or less of the illumination is reflected, thus resulting in contrast ratio of about 1:10 in the present example. Note that at 850 nm most of returned signal is from scattering at the object in contact with the optical element 106 (e.g. the skin of the user's finger).

The frustrated reflection directed on to the sensor is detected in order to identify the point or points of contact of the object in contact with the external surface 212. Subsequent measurements of the point or points of contact provide information corresponding to the movement of object on the external surface 212. The action or movement of the object can then be translated into actions to operate a mobile personal computer.

The optical navigation device may have a backlight provided by an LED separate to the LED 202, which provides the radiation source for the sensor 206. However, should the backlight remain on constantly, performance degradation can result. This is because the backlight illuminates the mousing surface and degrades the contrast of a fingerprint, thereby reducing the signal-noise ratio of the acquired image.

For good contrast of the fingerprint, the illumination optics ideally produces a collimated beam of light at an oblique angle (i.e. as close as possible to the plane of the surface) as possible. In comparison, the backlighting optics produces a smooth distribution of light over the surface and is as homogenous as possible. Hence the photons from the backlighting system do not provide good contrast of surface texture.

The backlight naturally uses wavelengths in the visible band while it is common for the navigation LED to be infrared (IR). The longer wavelength IR photons penetrate the silicon deeper before generating electron-hole pairs. A significant portion of the photo generated charge from the IR/navigation source will be generated in the bulk of the substrate which is usually highly doped. As a result the electron-hole pairs will recombine quickly and not be collected, and the device will have a reduced quantum efficiency. Hence, if the photon flux for the visible (backlighting) LED is the same as the IR (navigation) LED, the detector will receive a greater amount of (unwanted) signal from the visible (backlit) LED compared to the signal from the IR (navigation) LED and the image contrast will be further degraded.

Figure 3:
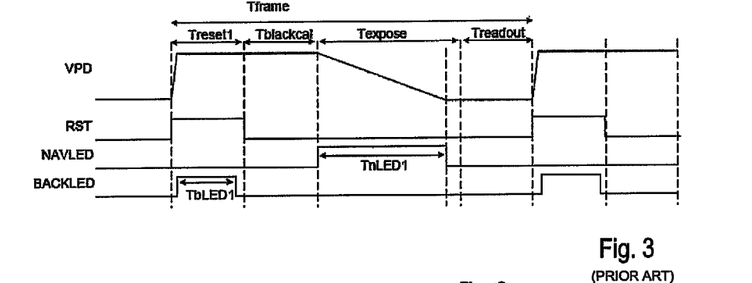
FIG. 3 is a timing diagram for a prior art optical navigation device with illumination.

FIG. 3 shows a typical timing diagram of prior art sensor operation. It shows a sensor operating in repeated cycles of four phases, during which the levels of the sensor photodiode voltage VPD, the reset line RST, the navigation LED NAV-LED and the Backlight LED, BACKLED are shown. The four phases are: a reset phase where the sensor's pixels are all reset to a predetermined voltage level, a black calibration phase whereby the sensor is calibrated so as to determine the appropriate output level in the absence of light, an expose phase where the sensor obtains an image and a readout phase, where the obtained image is read out for comparison to previous images to determine motion. This basic cycle of phases is well known for any imaging sensor.

The timing arrangement of FIG. 3 attempts to address the above signal degradation issue by turning the backlighting LED off during part of the frame so it does not interfere with the navigation operation. While it is possible to turn the backlighting LED on during dark calibration, this is disadvantageous as it would produce an offset into the pixel and reduce the dynamic range. Turning the backlight LED on during either exposure (Texpose) or readout (Treadout) will cause the degradation problems described above. Hence if the backlight is turned on during the reset phase (Treset1) the may backlighting not degrade the imaging/navigation system.

Normally this reset period (Treset1) is a short period (10 μs) compared to the total frame period (100 μs). Consequently, if this period is used to provide backlighting, the resulting duty cycle of the backlight is low (10% typical). This would produce a dim back light unless the peak current through the backlighting LED was increased accordingly. It is common for LEDs to be operated in this mode and their maximum current is typically dependent on the duty cycle of operation (thermal dissipation limits, so 1 A at duty cycle of 10% equals 100 mA constant).

However, this operation is undesirable in a mobile device as the large maximum current presents additional demands on the device's power management circuitry and the effect of voltage drops becomes more significant.

A mouse/navigation device sensor operation is different to that of a still camera/video camera/webcam in that the mouse/navigation device sensor can control the lighting. A significant further difference is that of frame-rate. For good performance (especially to avoid temporal aliasing—c.f. spokes on a wheel appearing to rotate backwards on TV/film) the mouse sensor operates at 1 kHz-10 kHz frame rate compared to 10-50 Hz of a DSC/webcam. To achieve high frame rates, not only should the pixel be very sensitive to light (U.S. Pat. No. 6,969,879, incorporated herein by reference describes such a sensitive pixel) but the mode of operation should be such that for most of the frame time it is sensitive to light, and the time of the non-imaging periods should be reduced.

For example, FIG. 3 shows equal time for the black calibration phase Tblackcal and readout phase Treadout, however black calibration phase Tblackcal is typically shorter than readout phase Treadout, using the technique described in U.S. Pat. No. 7,502,061 (hereby incorporated by reference).

Figure 4:
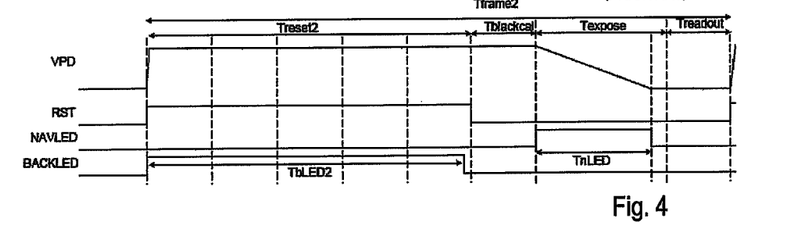
FIG. 4 is a timing diagram for an optical navigation device with illumination according to a first embodiment of the invention.

FIG. 4 is a timing diagram illustrating the operation of a navigation device with backlighting system according to an embodiment of the invention. The lines shown and phases (other than duration) are the same as that illustrated in FIG. 3. However, the reset phase (Treset2) has now been lengthened and is now the longest phase in the system. It is preferable that the period for which the backlight LED is on, TbLED2 is shorter than the reset phase Treset2, so that (a) the navigation device photo sensor does not detect any photons from the backlighting system, and (b) the backlighting LED is turned off in advance of the reset pulse so that the disturbance on the supply rails caused by turning off the current through the LED has disappeared before the pixel comes out of reset.

It will be appreciated that the above operational embodiment will result in a significant reduction of the frame rate. However, the inventor has determined that the higher frame rates used for a conventional optical desktop mouse are not necessarily used for smaller optical navigation devices such as illustrated in FIGS. 1 and 2 (although a frame rate much higher than cameras etc. is still required). This is because finger motor skills used when operating a finger operated device tend to be slower then arm motor skills used when operating a desktop mouse.

The width of the backlight LED (TbLED2) pulse can be varied to change the average intensity of the backlighting. Preferably, the reset (Treset2) pulse stays the same length and does not vary as the backlight LED (TbLED2) pulse varies.

This keeps the frame length (Tframe2) constant which simplifies the calculation of speed of the mouse. If desired (e.g. in power saving modes), there may be provided a set of frame (Tframe2) periods so that the frame rate of the mouse can be adapted to the mode of operation (e.g. high speed motion, medium speed motion, low speed motion, no motion & short sleep, no motion and medium sleep and no motion and long sleep period).

Instead of having just one output from the navigation device sensor, it is possible to have several outputs to control several LEDs. These may be of the same colour and designed to co-operate with the illumination optics to each illuminate only part of the surface (e.g. brighter centre and darker periphery or vice-versa), or else they may be of different colours for aesthetic or technical reasons.

Figure 5:
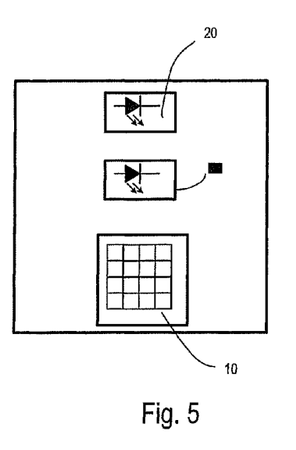
FIG. 5 is a schematic drawing of an optical navigation device according to the first embodiment of the invention.

FIG. 5 shows an optical navigation device according to said first embodiment of the invention. It comprises optical sensor 10, a navigation Light Emitting Diode (LED) 20 and a white or tricolour backlighting LED 30.

Figure 6:
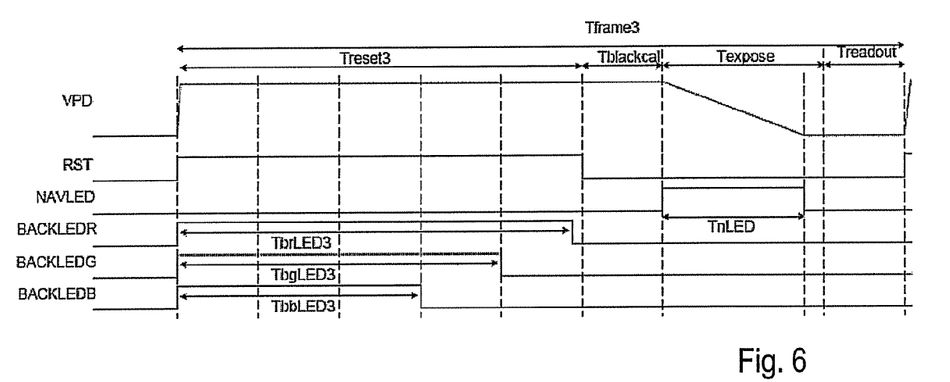
FIG. 6 is a timing diagram for an optical navigation device with illumination according to a second embodiment of the invention.

FIG. 6 illustrates such an arrangement where there are 3 separate illumination LED outputs, BACKLEDR, BACKLEDG, and BACKLEDB, each with different pulse widths. Although this represents a possible solution, it is not optimal as it results in either 0, 1, 2 or 3 backlighting LEDs illuminating at any one time, hence there is a large variation in the total supply current. This may pose issues for the system's power management block.

Figure 7:
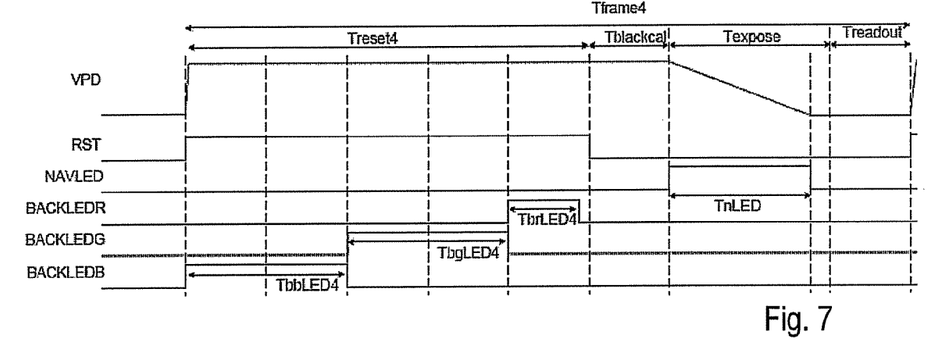
FIG. 7 is a timing diagram for an optical navigation device with illumination according to a third embodiment of the invention.

FIG. 7 illustrates an alternative arrangement to that illustrated in FIG. 6. In this embodiment the pulses for the backlighting LED channels BACKLEDR, BACKLEDG, BACKLEDB are non-overlapping. They are set such that as one turns off another is turned on. Not only does this reduce the maximum current required for backlighting to ⅓ of the system shown in FIG. 6 (assuming same current through each LED colour), but it keeps the current drain roughly constant during the reset period. In both cases this helps to minimise the inrush current into the mouse module.

Figure 8:
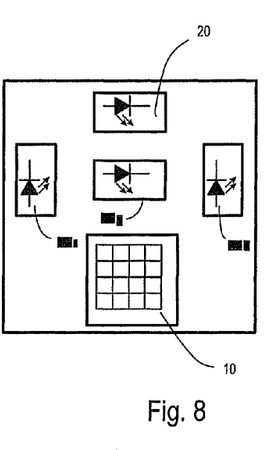
FIG. 8 is a schematic drawing of an optical navigation device according to the second and third embodiments of the invention.

FIG. 8 shows an optical navigation device according to said first embodiment of the invention. It comprises optical sensor 10, a navigation Light Emitting Diode (LED) 20 and three backlighting LEDs, red 30r, green 30g and blue 30b.

In the illustrated example, the LEDs are red, green and blue, these being additive primary colours that allow an illumination output in the other visible colours of the spectrum. In the specific example shown, the blue LED signal (BACKLEDB) is on for about the same period as the green LED signal (BACKLEDG) but only half the time of the red LED signal (BACKLEDR), i.e. duration of signal TbbLED4 equals duration of signal TbgLED4 equals 2× duration of signal TbrLED4. The ratio of the periods sets the colour of the backlight. For optimal navigational performance the total duration of signals TbbLED4, TbgLED4 and TbrLED4 is less than the duration of Treset4. The actual width/duty cycle of the backlighting pulse can be set in variety of manners.

Figure 9:
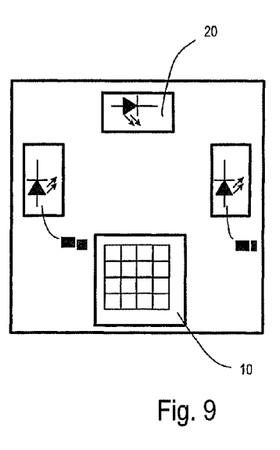
FIG. 9 is a schematic drawing of an optical navigation device according to a further embodiment of the invention.

FIG. 9 shows a variation on the optical navigation device according to FIG. 8. In this, two illumination LEDs are provided, a red and green bi-colour LED 30rg and a blue LED 30b.

The navigation device has, in some embodiments, a memory (e.g. I2C or SPI register) which the host controller of the host device (for example, phone, MP3 player or similar portable media player (PMP), Digital Still camera, satellite navigation system, remote control) can access to program the brightness/colour/width of the backlighting LED pulse. This can be useful for a variety of applications/enhancements of the device, for example:

For a Cellular Phone:

Backlight illuminates on incoming phone call or SMS message.

Backlight changes colour depending on if there is phone call or SMS message (e.g. white for incoming call and red for incoming text message).

Backlight illuminates with colour depending on caller ID of incoming phone call/SMS message (e.g. white for most calls, red for certain persons or group of persons, green for others etc.).

Backlight colour indicates battery power level—e.g. if battery levels are below a threshold then the navigation device backlight is commanded to illuminate red.

Backlight illuminates when the phone is being charged. It could be commanded to change colour to indicate either the level of charge or time remaining to fully charge the unit.

Backlight colour indicates RF signal strength—e.g. if received signal strength is above a certain threshold then the backlight could be commanded to show green light, similar to the number of "bars" on a conventional display.

Backlight could be commanded to illuminate or change colour when keys are depressed—The colour of the backlight could be commanded to change if the keys are depressed while the keylock is engaged.

For a MP3 Player or Personal Music Player:

Backlight colour indicates battery power level—e.g. if battery levels are below a threshold then the navigation device backlight is commanded to illuminate red.

Backlight illuminates or changes colour when the player is charging.

Backlight illuminates or changes colour when data is uploaded to the media player (e.g. red).

Backlight illuminates or changes colour when data is downloaded from the media player (e.g. green).

Backlight illuminates to indicate an "illegal operation" e.g. trying to reduce the volume control to below zero or above the maximum level.

Backlight illuminates or changes colour to warn the user—e.g. the volume is commanded to exceed a preset level.

The intensity or colour of the backlight is used to indicate the volume level.

The intensity and/or colour of the backlight can change in harmony with the sound being played, e.g. high average sound level produces a brighter backlight and the spectral content of the audio is mapped onto the colour of the illumination (e.g. predominantly low-frequency audio tones control the red LED, mid-tones to green LED and high frequency tones the blue LED).

Backlight colour/intensity indicates that the player has successfully connected to a host computer.

For a Camera:

Backlight illuminates or changes colour when the camera is acquiring an image.

Backlight illuminates or changes colour when the camera is processing an image.

Backlight illuminates, flashes or changes colour when the camera is in "self timer" mode, waiting to acquire an image (e.g. 8× green backlighting pulses at 1 second intervals followed by 2× red backlighting flashes just before the image is captured).

Backlight illuminates, flashes or changes colour to indicate an error condition—e.g. under exposure, over exposure, long exposure (longer than can be comfortably handheld), camera's memory store (SD/CF/xD/MS/SM) is full.

Backlight illuminates, flashes or changes colour to indicate that the camera is in a nonstandard or unusual mode of operation (e.g. manual focus, manual white balance, manual exposure).

Backlight colour indicates battery power level—e.g. if battery levels are below a threshold then the navigation device backlight is commanded to illuminate red.

Backlight colour/intensity indicates the camera has successfully connected to a host computer.

For a Satellite Navigation System:

Backlight illuminates, flashes or changes colour to indicate that the user is approaching their destination Backlight illuminates, flashes or changes colour to warn the driver of an approaching manoeuvre Backlight illuminates, flashes or changes colour to warn the driver of an approaching road traffic restriction (e.g. change in speed limit).

Backlight colour indicates battery power level—e.g. if battery levels are below a threshold then the navigation device/fingermouse backlight is commanded to illuminate red Backlight colour/intensity indicates the SatNav device has successfully connected to a host computer For a Remote Control Backlight colour indicates battery power level—e.g. if battery levels are below a threshold then the navigation device backlight is commanded to illuminate red.

Backlight colour/intensity indicates which controlling mode the remote control is operating in (e.g. red for DVD, blue for BlueRay, white for TV, green for radio etc.)

The backlighting can also be controlled by the navigation device itself, as illustrated by the following examples. When the device detects that there is motion over the surface of the sensor, the backlighting can be inhibited to reduce energy consumption (as the user's finger is probably obscuring the surface, it is not sensible to use energy to illuminate the user's finger as the lighting cannot be observed). It is common for navigation device engine to detect the presence or absence of features on the surface. This signal can also be used to control (e.g. enable/disable) the backlighting.

As well as independent control by either the host or the navigation sensor, it is desirable to have co-operative control. In this mode the host would command the sensor to illuminate one/several/all LEDs, but this be gated with information from the sensor. For example, BACKLEDR=I2C_register_RED AND NOT (MOUSE_MOTION)

In the example shown above, the host would request that the RED LED was turned on (for example to indicate a. low battery warning), but at the appropriate time, that is in the absence of motion over the surface of the sensor (i.e. finger not moving on the surface). This gating can be easily controlled by setting/clearing appropriate control bits via I2C or SPI register command.

The pulse widths of the LED may be set via a dedicated I2C memory location (e.g. 0×01=2 μs, 0×02=4 μs etc.) or else there may be proportional or percentage values stored, along with a global fader value, for example

| Register Address | Register Name | Register Function |
|---|---|---|
| N | REDPERCENT | 0 = LED off, 255 (FF) = LED maximum |
| N + 1 | GREENPERCENT | 0 = LED off, 255 (FF) = LED maximum |

-continued

| Register Address | Register Name | Register Function |
| --- | --- | --- |
| N + 2 | BLUEPERCENT | 0 = LED off, 255 (FF) = LED maximum |
| N + 3 | FADER | 0 = All LEDs off, 255(FF) = LED setting |

The host could then program in a particular colour, e.g. pink

N←0xFF # Red value
N+1←0xC0 # Green value
N+2←0xCB # Blue value
This could be turned on with
N+3←0xFF and the navigation device LED control would calculate the periods for TbrLED4 TbgLED4 & TbbLED4 such that the total of these periods is less than the period of Treset4.

If the period Treset4 changes (e.g. due to change from navigation engine), the device would automatically adjust the periods of TbrLED4 TbgLED4 & TbbLED4 to maintain the correct ratio. Further, if the host wished to dim the backlight and keep the same colour, a single register write is used.

Should the navigation device sensor integrate an ambient light detector (for an example, see applicant's co-pending application—attorney ref P113944.GB.01) not only should the navigation LED be disabled when device is measuring ambient light, but also the background illumination should be disabled when the device is measuring ambient light. The sensor for detecting ambient light may, in an embodiment, be the same sensor as the navigation device sensor.

The above embodiments are for illustration only and other embodiments and variations are possible and envisaged without departing from the spirit and scope of the invention. For example the actual type of optical navigation device is not relevant so long as it is of a type that uses a radiation device and sensor to determine movement and at least a further radiation device for illumination. Also, the above non-exhaustive list of possible examples are purely illustrative of the utility of the invention disclosed herein.

That Which is claimed:

1. An optical navigation device for operation of an electronic device and operable in recurrent cycles of a reset phase, an expose phase, and a readout phase, the optical navigation device comprising:
   a navigation radiation source configured to produce a radiation beam;
   an optical element in a path of the radiation beam and having a mousing surface;
   a sensor configured to receive images based upon radiation reflected from an adjacent object in the path of the radiation beam as the object is moved across the mousing surface while in direct contact therewith, with movement of the object being translated into actions to operate the electronic device;
   at least one illumination source configured to radiate during the reset phase to provide a collimated beam of light at an oblique angle to the mousing surface so as to backlight the mousing surface of said optical element and to not radiate during the expose and readout phase, the reset phase having a longer duration than the expose phase and the readout phase; and
   said sensor is configured to be reset to a threshold level during the reset phase, to determine a sensor output level in an absence of light during the calibration phase, to receive the image during the expose phase, and to output the image during the readout phase.

2. An optical navigation device as in claim 1, wherein the duration of the reset phase is at least equal to a sum of durations of the expose phase and the readout phase.

3. An optical navigation device as in claim 1, wherein said at least one illumination source is configured to switch off before an end of the reset phase.

4. An optical navigation device as in claim 1, wherein said at least one illumination source is configured to not activate while said sensor is receiving images indicative of movement of the adjacent object, or while said sensor is receiving images with detectable features.

5. An optical navigation device as in claim 1, wherein said at least one illumination source is configured such that a duration that said at least one illumination source is activated during each reset phase is variable so as to control illumination intensity.

6. An optical navigation device as in claim 5, wherein the duration that said at least one illumination source is configured to be activated during each reset phase does not alter the duration of said reset phase.

7. An optical navigation device as in claim 1, wherein said at least one illumination source is configured to be controllable.

8. An optical navigation device as in claim 1, wherein said at least one illumination source is configured to be dependent upon a device status.

9. An optical navigation device as in claim 1, wherein said at least one illumination source comprises a plurality thereof.

10. An optical navigation device as in claim 9, wherein each of said plurality of illumination sources is configured to illuminate a different portion of said navigation device.

11. An optical navigation device in claim 9, wherein each of said plurality of illumination sources is configured to output a different color of visible light.

12. An optical navigation device as in claim 11, wherein said plurality of illumination sources comprises first, second, and third illumination sources configured to output red, green, and blue light, respectively.

13. An optical navigation device as in claim 11, wherein said plurality of illumination sources is configured such that one of said plurality thereof is on at a given time.

14. An optical navigation device as in claim 11, wherein at least two of said plurality of illumination sources are configured to be turned on during the reset phase, such that a ratio of durations that each illumination source is turned on determines perceived illumination color.

15. An optical navigation device as in claim 14, wherein the ratio of durations is controllable.

16. An optical navigation device as in claim 14 wherein the ratio of durations is based upon a device status.

17. An optical navigation device as in claim 14, wherein the ratio of durations is set proportionally; and wherein an illumination intensity of said plurality of illumination sources is configurable.

18. An optical navigation device as in claim 11, wherein said plurality of illumination sources is configured to achieve a perceived constant illumination intensity for different colors by adjusting an actual illumination intensity to allow for relative sensitivities of a human eye to different colors.

19. An optical navigation device as in claim 18, wherein said plurality of illumination sources is configured to further adjust for different efficiencies in different color illumination sources to achieve the perceived constant illumination intensity.

20. An optical navigation device as in claim 1, further comprising an ambient light detector; and wherein said at least one illumination source is configured to be turned off when said ambient light detector is activated.

21. An optical navigation device as in claim 1, wherein said sensor comprises an ambient light detector configured to be activated when said at least one illumination source is turned off.

22. An optical navigation device for operation of an electronic device and operable in a reset phase, an expose phase, and a readout phase, the optical navigation device comprising
a navigation radiation source configured to produce a radiation beam;
an optical element in a path of the radiation beam and having a mousing surface;
a sensor configured to receive images based upon radiation reflected from an adjacent object in the path of the radiation beam as the object is moved across the mousing surface while in direct contact therewith, with movement of the object being translated into actions to operate the electronic device; and
at least one illumination source configured to radiate during the reset phase to provide a collimated beam of light at an oblique angle to the mousing surface so as to backlight the mousing surface of said optical element and to not radiate during the expose and readout phase, a duration of the reset phase being at least equal to a sum of durations of the expose phase and the readout phase;
said sensor is configured to be reset to a threshold level during the reset phase, to determine a sensor output level in an absence of light during the calibration phase, to receive the image during the expose phase, and to output the image during the readout phase.

23. An optical navigation device as in claim 22, wherein said at least one illumination source is configured to switch off before an end of the reset phase.

24. An optical navigation device as in claim 22, wherein said at least one illumination source is configured to not activate while said sensor is receiving images indicative of movement of the adjacent object, or while said sensor is receiving images with detectable features.

25. An optical navigation device as in claim 22, wherein said at least one illumination source is configured such that a duration that said at least one illumination source is activated during each reset phase is variable so as to control illumination intensity.

26. A method of controlling illumination of an optical navigation device for operation of an electronic device and operable in recurrent cycles of a reset phase, an expose phase, and a readout phase, the method comprising:
producing a radiation beam using a navigation radiation source, with an optical element in a path of the radiation beam and having a mousing surface;
receiving at a sensor images based upon radiation reflected from an adjacent object in the path of the radiation beam as the object is moved across the mousing surface while in direct contact therewith, with movement of the object being translated into actions to operate the electronic device;
radiating from at least one illumination source during the reset phase to provide a collimated beam of light at an oblique angle to the mousing surface so as to backlight the mousing surface of the optical element and to not radiate during the expose and readout phase, the reset phase having a longer duration than the expose phase and the readout phase;
the sensor is configured to be reset to a threshold level during the reset phase, to determine a sensor output level in an absence of light during the calibration phase, to receive the image during the expose phase, and to output the image during the readout phase; and
identifying movement of the adjacent object to thereby enable a control action to be carried out.

27. a method as in clam 26, wherein the duration of the reset phase is at least equal to a sum of durations of the expose phase and the readout phase; and
wherein the illumination source is switched off before an end of the reset phase.

28. A method as in claim 26, wherein the at least one illumination source is not activated while the sensor is receiving images indicative of movement of the adjacent object, or while the sensor is receiving images with detectable features.

29. A method as in claim 26, wherein a duration that the at least one illumination source is activated during each reset phase is variable so as to control illumination intensity.

30. A method as in claim 29 wherein the duration that the at least one illumination source is configured to be activated during each reset phase does not alter the duration of the reset phase.

31. A method as in claim 26, wherein the illumination source is selectably controllable.

32. A method as in claim 26, wherein the at least one illumination source is configured to be dependent upon a device status.

33. A method as in claim 26, wherein the at least one illumination source comprises a plurality thereof.

34. A method as in claim 33, wherein each of the plurality of illumination sources illuminates a different portion of the navigation device.

35. A method as in claim 33, wherein each of the plurality of illumination sources outputs a different color of visible light.

36. A method as in claim 35, wherein the plurality of illumination sources comprises first, second, and third illumination sources configured to output red, green, and blue light, respectively.

37. A method as in claim 35, wherein the plurality of illumination sources is configured such that one of the plurality thereof is on at a given time.

38. A method as in claim 35, wherein at least two of the plurality of illumination sources are turned on during the reset phase, such that a ratio of durations that each illumination source is turned on determines perceived illumination color.

39. A method as in claim 38, wherein the ratio of durations is selectably controllable.

40. A method as in claim 38, wherein the ratio of durations is based upon a status of the navigation device.

41. A method as in claim 38, wherein the ratio of durations is set proportionally; and wherein an illumination intensity of the plurality of illumination sources is selectably configurable.

42. A method as in claim 33, wherein the plurality of illumination sources achieves a perceived constant illumination intensity for different colors by adjusting an actual illumination intensity to allow for relative sensitivities of a human eye to different colors.

43. A method as in claim 42, wherein the plurality of illumination sources further adjusts for different efficiencies in different color illumination sources to achieve the perceived constant illumination intensity.

44. A method as in claim 26, wherein the illumination source is to be turned off when an ambient light detector is activated.

45. An electronic device comprising:
- an optical navigation device operable in recurrent cycles of a reset phase, an expose phase, and a readout phase, said optical navigation device comprising
  - a navigation radiation source configured to produce a radiation beam,
  - an optical element in a path of the radiation beam and having a mousing surface,
  - a sensor configured to receive images based upon radiation reflected from an adjacent object in the path of the radiation beam as the object is moved across the mousing surface while in direct contact therewith, with movement of the object being translated into actions to operate the electronic device,
  - at least one illumination source configured to radiate during the reset phase to provide a collimated beam of light at an oblique angle to the mousing surface so as to backlight the mousing surface of said optical element and to not radiate during the expose and readout phase, the reset phase having a longer duration than the expose phase and the readout phase, and
  - said sensor is configured to be reset to a threshold level during the reset phase, to determine a sensor output level in an absence of light during the calibration phase, to receive the image during the expose phase, and to output the image during the readout phase.

46. An electronic device as in claim 45, wherein the electronic device comprises a mobile computing device.

47. An electronic device as in claim 45, wherein the electronic device comprises a mobile telecommunications device.

48. An electronic device as in claim 45, wherein the electronic device comprises a remote control device.

* * * * *